US012598986B2

(12) United States Patent
Li et al.

(10) Patent No.: US 12,598,986 B2
(45) Date of Patent: Apr. 7, 2026

(54) METAL INSULATOR METAL CAPACITOR (MIM CAPACITOR)

(71) Applicant: INTERNATIONAL BUSINESS MACHINES CORPORATION, Armonk, NY (US)

(72) Inventors: Baozhen Li, South Burlington, VT (US); Chih-Chao Yang, Glenmont, NY (US); Huimei Zhou, Albany, NY (US); Yueming Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 18/337,069

(22) Filed: Jun. 19, 2023

(65) Prior Publication Data

US 2024/0421067 A1 Dec. 19, 2024

(51) Int. Cl.
| | |
|---|---|
| *H01L 23/522* | (2006.01) |
| *H01L 23/528* | (2006.01) |
| *H10D 1/00* | (2025.01) |
| *H10D 1/68* | (2025.01) |

(52) U.S. Cl.
CPC ...... *H01L 23/5223* (2013.01); *H01L 23/5283* (2013.01); *H10D 1/042* (2025.01); *H10D 1/714* (2025.01); *H10D 1/716* (2025.01)

(58) Field of Classification Search
CPC . H01L 23/5223; H01L 23/5283; H10D 1/042; H10D 1/714; H10D 1/716
See application file for complete search history.

(56) References Cited

U.S. PATENT DOCUMENTS

| | | | |
|---|---|---|---|
| 6,934,143 B2 * | 8/2005 | Chou | H01L 23/5223 |
| | | | 29/25.42 |
| 7,796,372 B2 | 9/2010 | Cremer | |
| 8,143,699 B2 | 3/2012 | Ching | |
| 10,229,873 B2 | 3/2019 | Kim | |
| 10,461,148 B1 | 10/2019 | Reznicek | |
| 2022/0068794 A1 * | 3/2022 | Welsh | H01L 23/5223 |
| 2022/0123101 A1 | 4/2022 | Li | |
| 2022/0139820 A1 | 5/2022 | Liang | |

* cited by examiner

*Primary Examiner* — Patricia D Valenzuela
(74) *Attorney, Agent, or Firm* — Daniel M. Yeates

(57) ABSTRACT

A semiconductor device including a metal insulator metal capacitor (MIM capacitor) within back end of line circuitry of the semiconductor device, where the MIM capacitor surrounds a first Mx metal line. A semiconductor device including a metal insulator metal capacitor (MIM capacitor) within back end of line circuitry of the semiconductor device, where the MIM capacitor surrounds a first Mx metal line, where a lower horizontal surface of the MIM capacitor is vertically adjacent to an upper horizontal surface of an Mx-1 metal line. A method including forming a metal insulator metal capacitor (MIM capacitor) within back end of line circuitry of the semiconductor device, where the MIM capacitor surrounds a first Mx metal line.

17 Claims, 17 Drawing Sheets

Section X1-X1

Section X2-X2

Section Y-Y

Section X1-X1

Section X2-X2

Section Y-Y

Section X1-X1

Section X2-X2

Section Y-Y

Section X1-X1

Section X2-X2

Section Y-Y

Section X1-X1

Section X1-X1

Section X1-X1

METAL INSULATOR METAL CAPACITOR (MIM CAPACITOR)

BACKGROUND

The present invention relates, generally, to the field of semiconductor manufacturing, and more particularly to a metal-insulator-metal (MIM) capacitor.

MIM capacitors are a key element for integration of system-on-chips, improving both circuit performance and down-scaling capability. A typical MIM capacitor includes a top metal electrode, a dielectric/insulator layer and a bottom metal electrode. Voltage is applied across the metal electrodes which results in charge storage within the formed capacitor configuration. MIM capacitors are used in functional circuits such as mixed signal circuits, analog circuits, radio frequency (RF) circuits, dynamic random access memory (DRAM), embedded DRAM, and logic operation circuits. In general, for a MIM capacitor in an RF application, a dielectric loss must be extremely small, and a series resistance of the wiring should be minimized for high frequency applications. This indicates that it is desirable to use short interconnect wires with a low specific resistance. A MIM capacitor integrated in back end of line (BEOL) metallization is suitable to fulfill these requirements.

The MIM capacitor is usually embedded into upper back-end-of-the-line (BEOL) layers. Traditional methods of fabricating a MIM capacitor include stacking of multiple MIM capacitor layers that involve numerous lithography and etching steps. Some MIM capacitor designs require many extra processing steps that may not be easily integrable into a conventional BEOL process. A complexity of current MIM capacitor fabrication methods can cause problems during the semiconductor manufacturing process that can limit capacitance density and negatively impact yield improvement on other BEOL elements.

SUMMARY

According to an embodiment of the present invention, a semiconductor device is provided. The semiconductor device including a metal insulator metal capacitor (MIM capacitor) within back end of line circuitry of the semiconductor device, where the MIM capacitor surrounds a first Mx metal line.

According to an embodiment of the present invention, a semiconductor device is provided. The semiconductor device including a metal insulator metal capacitor (MIM capacitor) within back end of line circuitry of the semiconductor device, where the MIM capacitor surrounds a first Mx metal line, where a lower horizontal surface of the MIM capacitor is vertically adjacent to an upper horizontal surface of an Mx-1 metal line.

According to an embodiment of the present invention, a method is provided. The method including forming a metal insulator metal capacitor (MIM capacitor) within back end of line circuitry of the semiconductor device, where the MIM capacitor surrounds a first Mx metal line.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
FIG. 1 illustrates a top view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a metal-insulator-metal (MIM) capacitor.

There is a high demand for on chip capacitors, such as MIM capacitors, in high performance chip designs. Advanced technologies usually offer two types of back end of line (BEOL) capacitors, a plane high capacitance density MIM capacitor at higher metal, and metal finger arrays which provides a low capacitance density. A plane high capacitance density MIM capacitor has planner metal plates with a high-k dielectric thin film (such as HfO2, Al2O3, ZrO2, Ta2O5, or a combination) sandwiched between the planner metal plates. The plane high capacitance density MIM capacitor is built between two different metal wire levels. A metal finger array MIM capacitors include an array of parallel metal lines from the same metal wire level. These parallel metal lines serve as electrodes, and the inter-line dielectric (ILD) (usually a low k or a silicon-based oxide) between the metal lines serves as insulator layer for the capacitor. For some high performance devices, e.g. SRAM, there is a need for "local" decoupling capacitors to boost performance and yield. Metal finger arrays have a capacitance density which is too low, and would need a large area of the chip to increase the capacitance. A local capacitor, near electronic components of the chip is preferred, such as a MIM capacitor.

Figure 5:
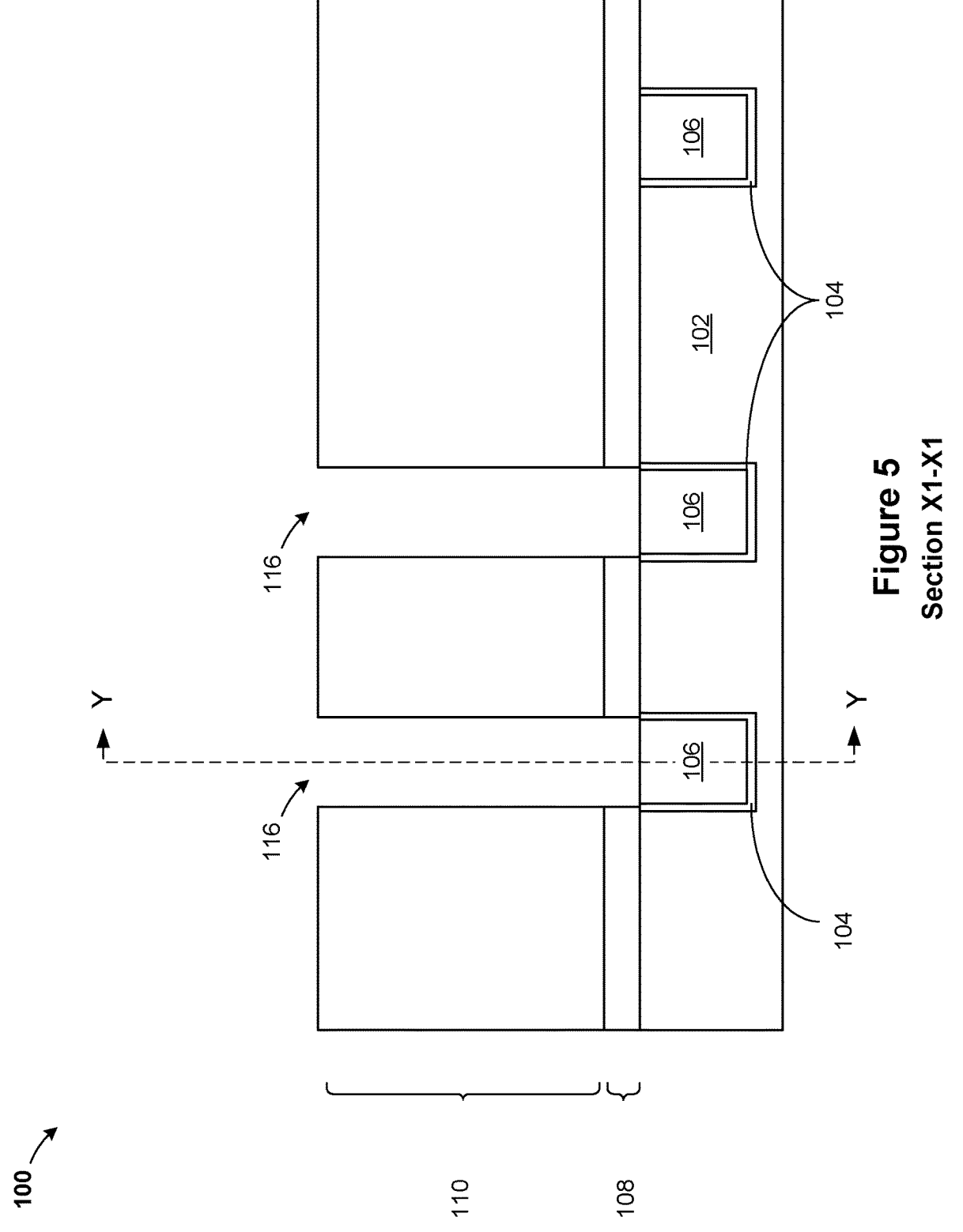
FIGS. 5, 6 and 7 each illustrate a cross-sectional view of the semiconductor structure along section line X1-X1, X2-X2 and Y-Y, respectively, and illustrate formation of an opening according to an exemplary embodiment.
Figure 7:
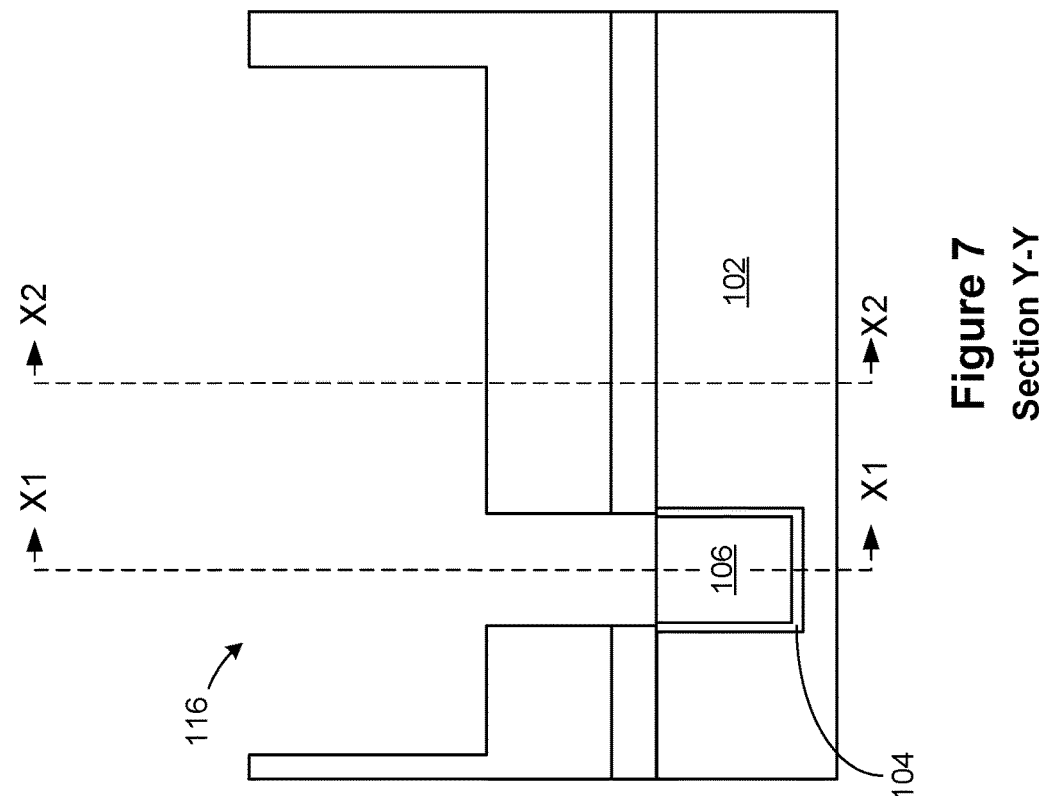
Figure 7:

There is a need for a high capacitance density capacitor at lower metal levels of the BEOL to meet a device performance boost of performance and yield. In this invention, the MIM capacitor formation is compatible with damascene BEOL integration, using existing metal layers as electrodes. This MIM capacitor has higher capacitance with a lower series resistance compared to traditional MIM capacitor. The MIM capacitor needs only one additional (block) mask to pattern contact vias (as shown in FIG. 5) and one additional mask for patterning trenches (as shown in FIG. 7).

In this invention, the MIM capacitor may have three plates, terminals or connectors to the MIM capacitor, rather than the traditional two plates, terminals or connectors to the MIM capacitor. The MIM capacitor may have a higher capacitance density compared to a traditional MIM capacitor due to the three plate, or three terminal, option.

The MIM capacitor may have a higher capacitance density, which can be up to 30% higher than a traditional MIM capacitor, depending on a high k material used and a thickness of the high k material. The MIM capacitor may have a higher capacitance density when fully taking advantage of the 3 plate option, such as connecting two terminals together as a single electrode. The MIM capacitor may have greater flexibility for different voltage applications. For example, for a high voltage application, two of the terminals may be connected to form a first electrode and the third terminal may be a second electrode.

The MIM capacitor may have greater flexibility of placement compared to a traditional MIM capacitor due to using existing spacing in BEOL and use of normal wiring, above and below the Mx metal lines.

The MIM capacitor has significant high value attributes. The high capacitance density MIM capacitor can be used at a Mx metal line level near a device whose performance needs to be enhanced and correspondingly requires higher capacitance of the MIM capacitor.

The high capacitance density MIM capacitor can accommodate regular interconnect wires, such as copper interconnect wires.

In this invention, the MIM capacitor may have up to 3 terminals. The MIM capacitor may have a first terminal which uses an Mx wire or Mx word line as the electrode. The MIM capacitor may have a second terminal which uses a metal wire below (Mx-1 wire or Mx-1 word line) connected to an outer electrode (such as titanium nitride (TiN), TaN, or other material). The MIM capacitor may have a third terminal which connects to an inner side of the outer electrode. Increasing to three terminals for the MIM capacitor rather than the traditional two terminal has an advantage of flexibility to be used as either a high capacitance density or a high voltage MIM capacitor.

In this invention, the MIM capacitor may be formed between adjacent Mx metal lines, which has an advantage of taking advantage of existing metallization architecture and processes.

In this invention, the MIM capacitor may be formed surrounding one or more Mx metal lines, which has an advantage of tailoring a size of the MIM capacitor based on capacitance requirements.

In this invention, the MIM capacitor may be formed with more than one connection to an Mx-1 metal line, which has an advantage of an increased capacitance of the MIM capacitor and a decrease of an electrode/connection resistance when connecting to the MIM capacitor.

In this invention, an array of MIM capacitors may be formed, all of which may be connected by the Mx-1 metal lines, which has an advantage of efficiently utilizing the chip area to maximizing a total capacitance.

The present invention relates, generally, to the field of semiconductor manufacturing, and more particularly to a metal-insulator-metal (MIM) capacitor.

Figure 2:
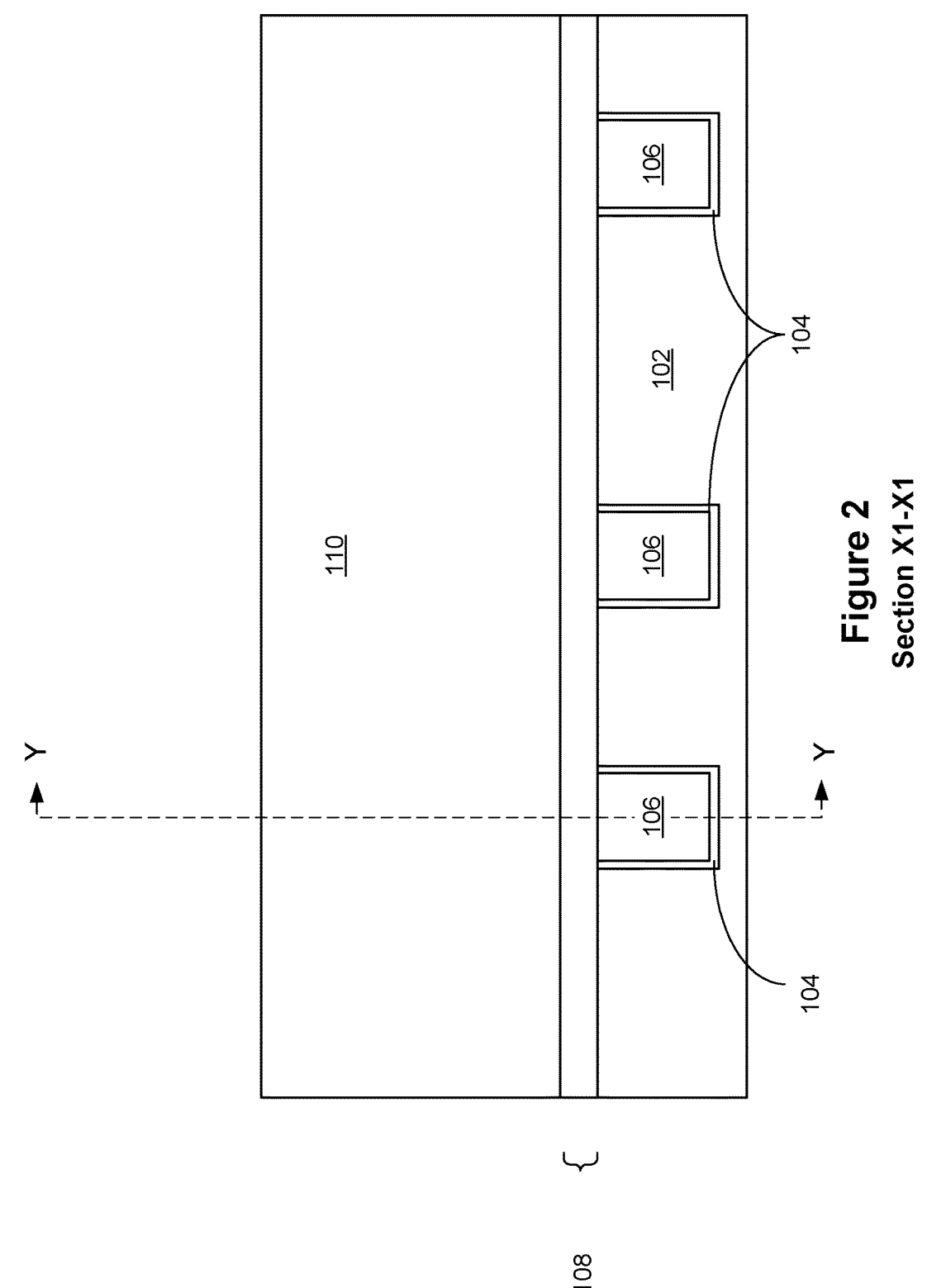
FIGS. 2, 3 and 4 each illustrate a cross-sectional view of the semiconductor structure according to FIG. 1, along section line X1-X1, X2-X2 and Y-Y, respectively, according to an exemplary embodiment.
Figure 3:
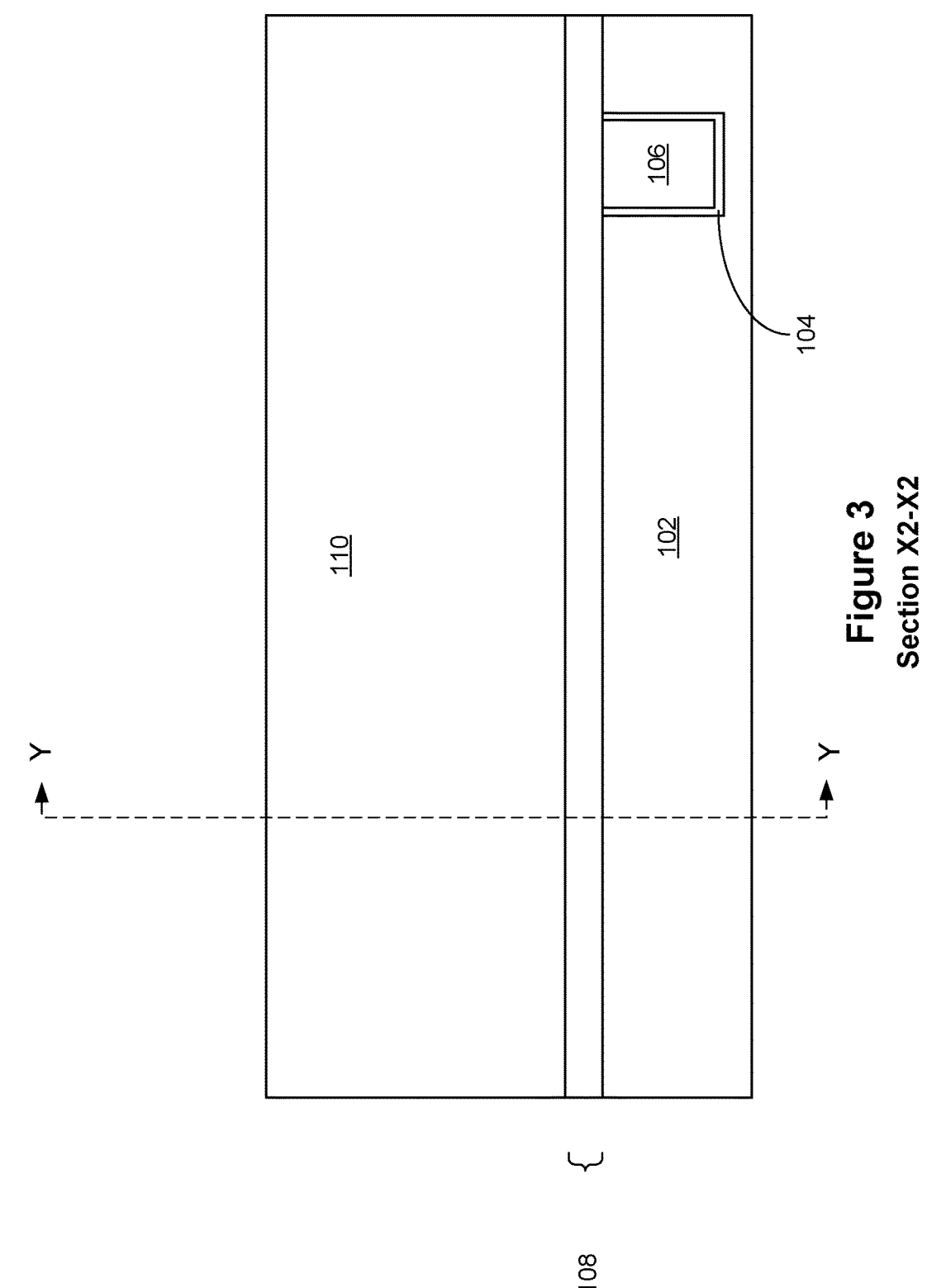
Figure 4:
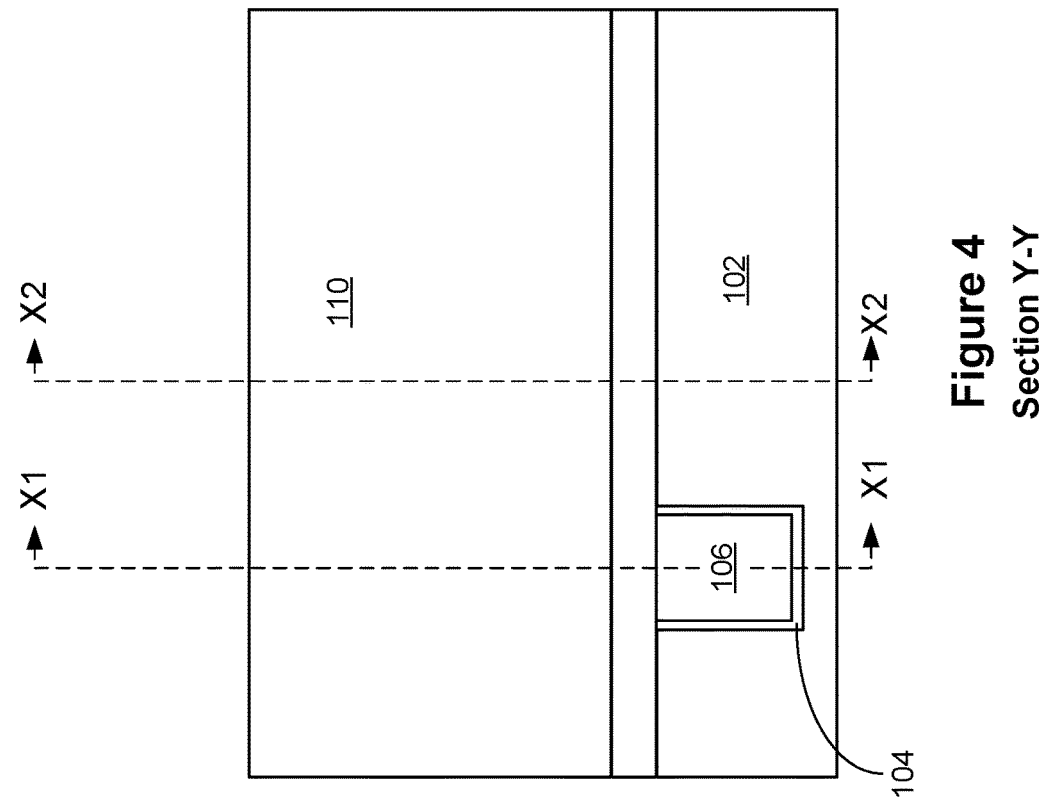

Referring now to FIGS. 1, 2, 3 and 4, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X1-X1. FIG. 3 is a cross-sectional view of the structure 100 along section line X2-X2. FIG. 4 is a cross-sectional view of the structure 100 along section line Y-Y. FIGS. 2 and 3 are each perpendicular to the section line Y-Y. The structure 100 may be formed or provided. The structure 100 may include an inter-layer dielectric (hereinafter "ILD") 102, a liner 104, an Mx-1 metal line 106, a dielectric cap 108, and an inter-layer dielectric (hereinafter "ILD") 110.

The structure 100 may include several back end of line ("BEOL") layers. In general, the back end of line (BEOL) is where individual devices (transistors, capacitors, resistors, etc.) are interconnected with wiring on a semiconductor wafer.

The ILD 102 may be formed by depositing or growing a dielectric material on the BEOL layers, followed by a chemical mechanical polishing (CMP) or etch steps. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the ILD 102 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The Mx-1 metal line 106 may be formed by first patterning a trench (not shown) into the ILD 102, lining the trench with the liner 104, and filling the trench. The liner 104 separates the conductive interconnect material of the Mx-1 metal line 106 from the ILD 102. The liner 104 may be composed of, for example, tantalum nitride (TaN), tantalum (Ta), titanium (Ti), titanium nitride (TiN), cobalt (Co) or a combination thereof. The liner 104 may be deposited utilizing a conventional deposition process such as, for example, CVD, plasma enhanced chemical vapor deposition (PECVD), PVD or ALD. The liner 104 may be 5 nm thick, although a thickness less than or greater than 5 nm may be acceptable. The liner 104 surrounds a lower horizontal surface and a vertical side surface of the Mx-1 metal line 106.

In an embodiment, the Mx-1 metal line 106 is formed from a conductive material layer which is blanket deposited on top of the structure 100, and directly on an upper horizontal surface of the ILD 102, and directly on a top surface of the liner 104, filling the trench (not shown). The conductive material layer may include materials such as, for example, copper (Cu), ruthenium (Ru), cobalt (Co), aluminum (Al), tungsten (W), tantalum nitride (TaN) and titanium nitride (TiN). The conductive material can be formed by for example, electrochemical plating, chemical vapor deposition (CVD), physical vapor deposition (PVD), and atomic layer deposition (ALD) or a combination thereof. The Mx-1 metal line 106 is formed by damascene, or patterned from the conductive material layer, using known patterning and etching techniques. There may be any number of openings in the ILD 102, each filled with the liner 104 and the Mx-1 metal line 106, on the structure 100.

A planarization process, such as, for example, chemical mechanical polishing (CMP), may be done to remove excess material from an upper horizontal surface of the structure 100 such that upper horizontal surfaces of the Mx-1 metal line 106, the liner 104 and the ILD 102 are coplanar. In an embodiment, the Mx-1 metal line 106 may have a thickness ranging from about 10 nm to about 200 nm, although a thickness less than 10 nm and greater than 200 nm may be acceptable.

The dielectric cap 108 may be formed as described for the ILD 102, directly on a top surface of the liner 104, the Mx-1 metal line 106 and the ILD 102. The dielectric cap 108 may have a thickness ranging from about 5 nm to about 100 nm, although a thickness less than 5 nm and greater than 100 nm may be acceptable. The dielectric cap 108 provides a thin protection layer on Cu surface for better adhesion and reliability, helping to reduce electromigration, stress migration and temperature cycling.

The ILD 110 may be formed as described for the ILD 102, directly on an upper horizontal surface of the dielectric cap 108.

Figure 6:
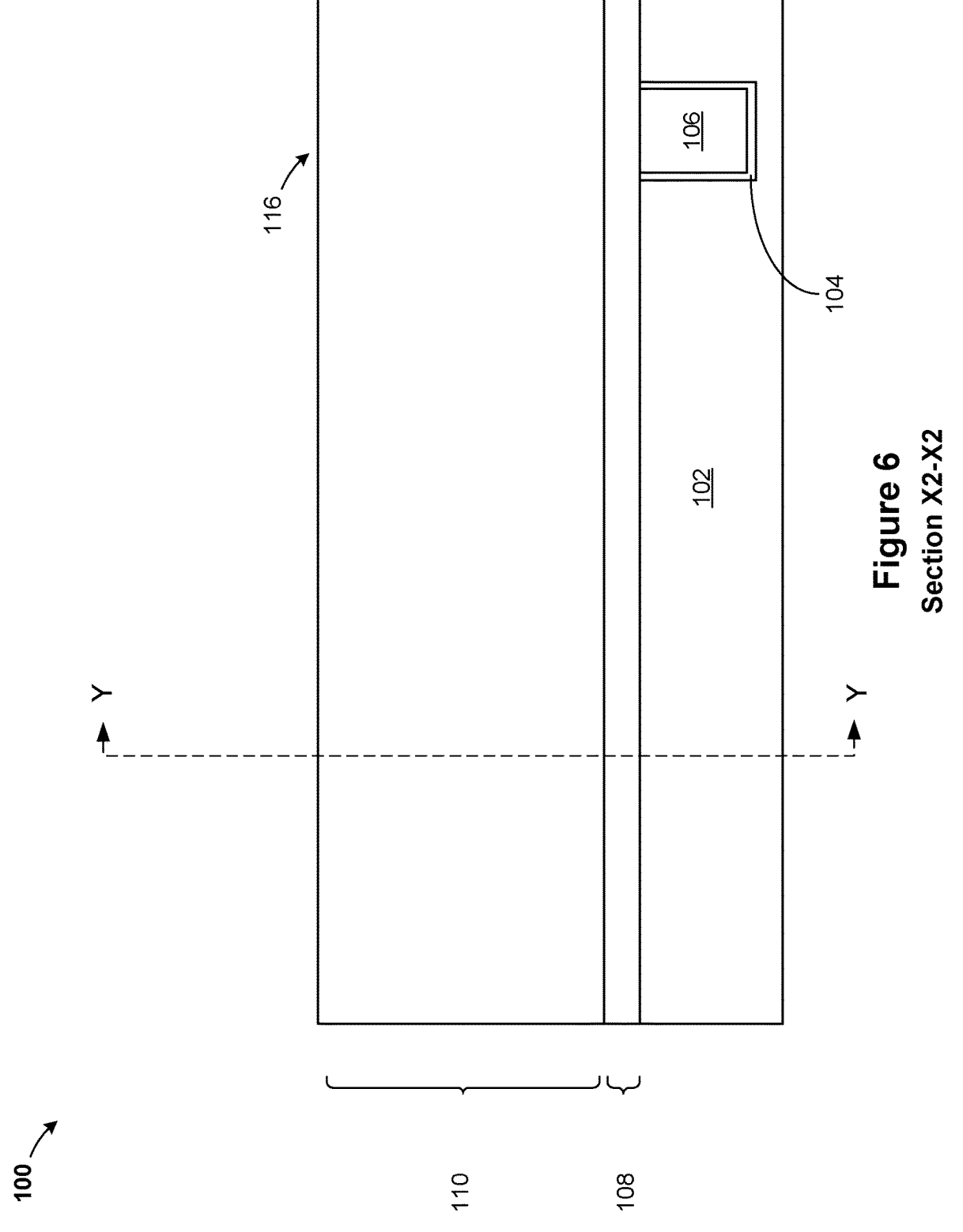

Referring now to FIGS. 5, 6 and 7, the structure 100 is shown according to an exemplary embodiment. FIGS. 5 and 6 are each a cross-sectional view of the structure 100 along section lines X1-X1 and X2-X2, respectively. FIG. 7 is a cross-sectional view of the structure 100 along section line Y-Y. FIGS. 5 and 6 are each perpendicular to section line Y-Y. A trench 116 may be formed.

The trench 116 may be formed by removal of portions of the ILD 110 and portions of the dielectric cap 108 by selective etching, such as reactive etching (RIE). An upper horizontal surface of the Mx-1 metal line 106 may be exposed in the trench 116. An upper horizontal surface of the ILD 110 may be exposed in the trench 116. The trench 116 may expose the upper horizontal surface of the Mx-1 metal line 106. In an alternate embodiment, the trench 116 may expose a portion of the upper horizontal surface of the Mx-1 metal line 106. In a further alternate embodiment, the trench 116 may expose an upper horizontal surface of the ILD 110, and be vertically aligned above the Mx-1 metal line 106, for example 20 to 100 nm above the upper horizontal surface of the Mx-1 metal line 106. In this further alternate embodiment, a depth of the trench 116 may correspond to a subsequently formed Vx via.

Figure 8:
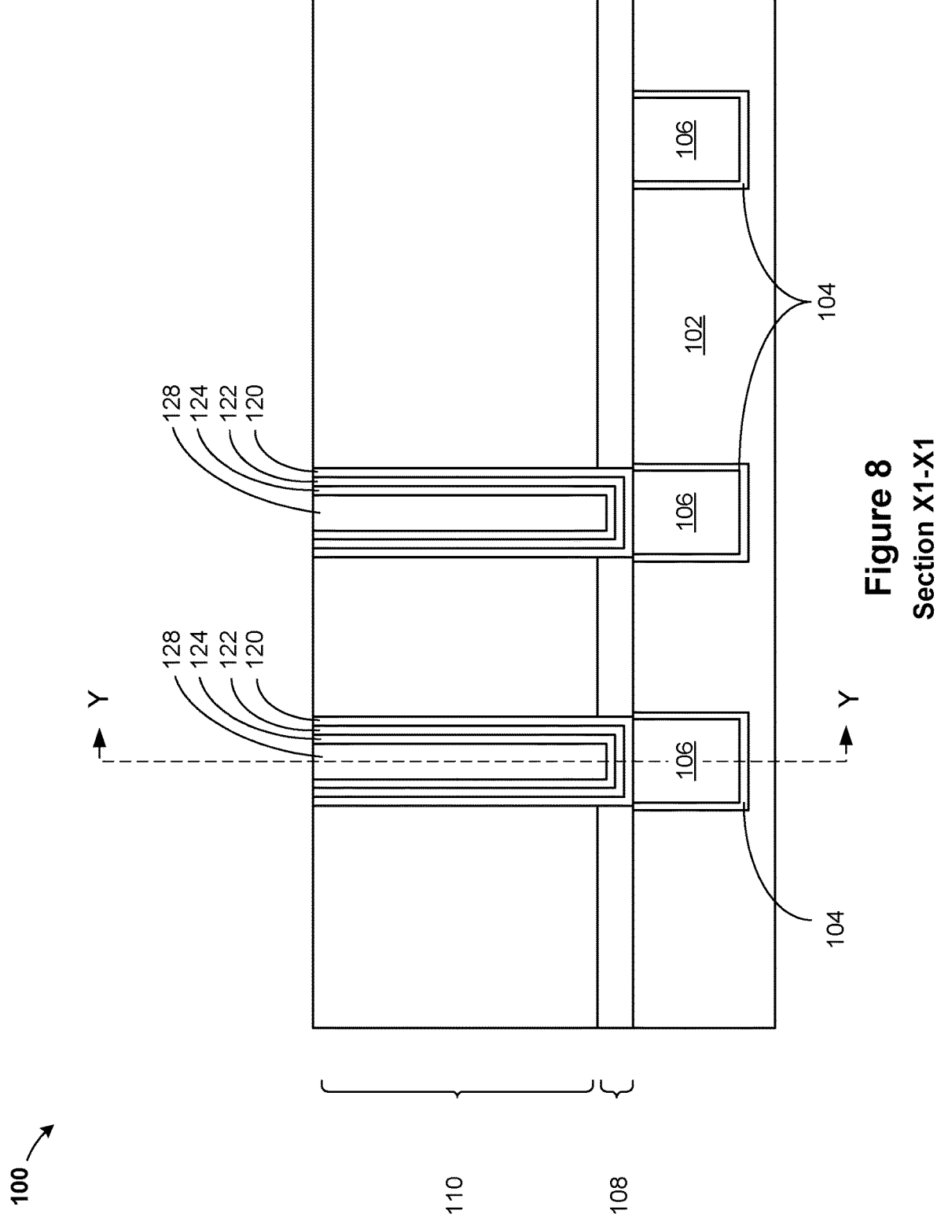
FIGS. 8, 9 and 10 each illustrate a cross-sectional view of the semiconductor structure along section line X1-X1, X2-X2 and Y-Y, respectively, and illustrate formation of an outer plate, an insulator, an inner plate and an inter-layer dielectric, according to an exemplary embodiment.
Figure 9:
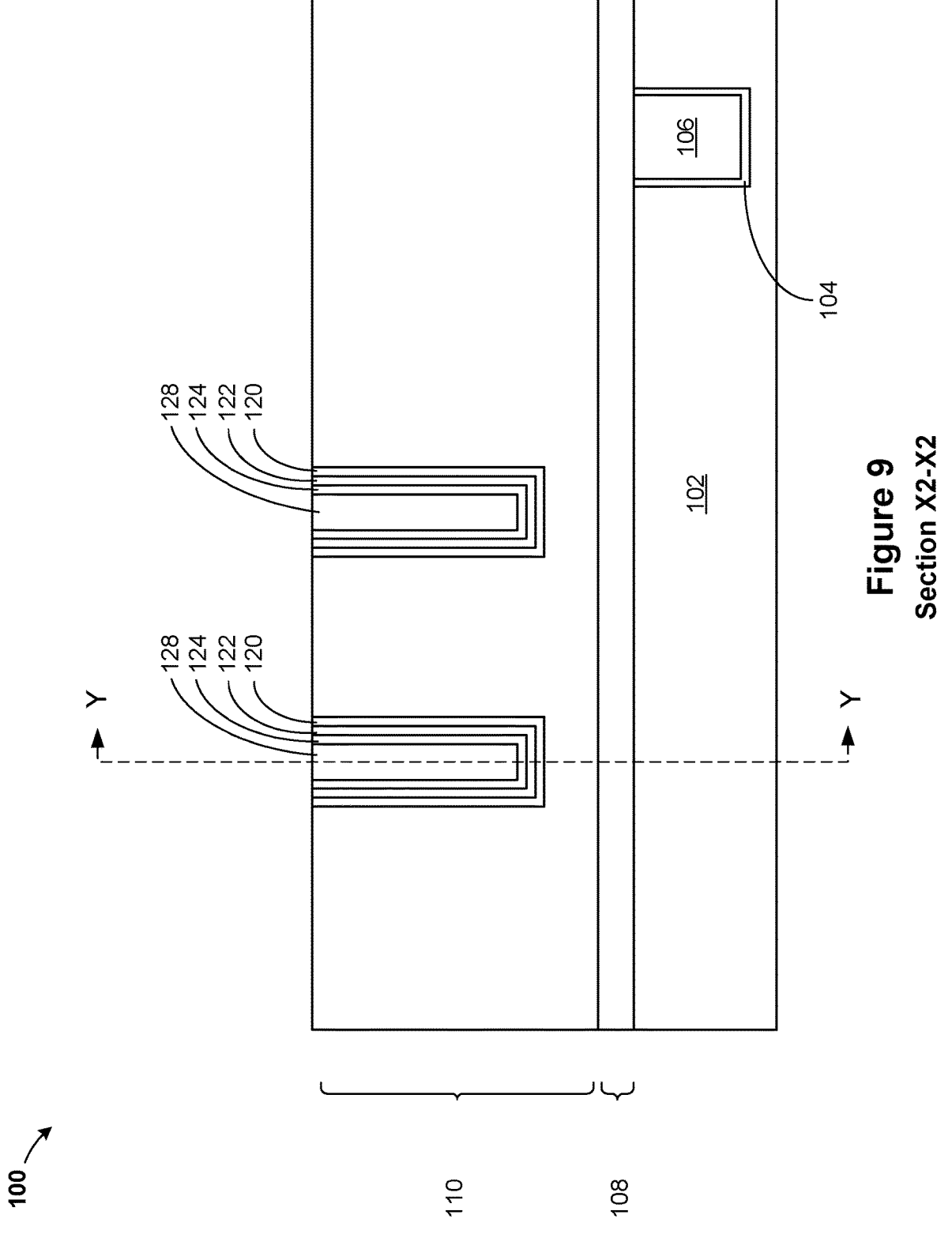
Figure 10:
Figure 10:
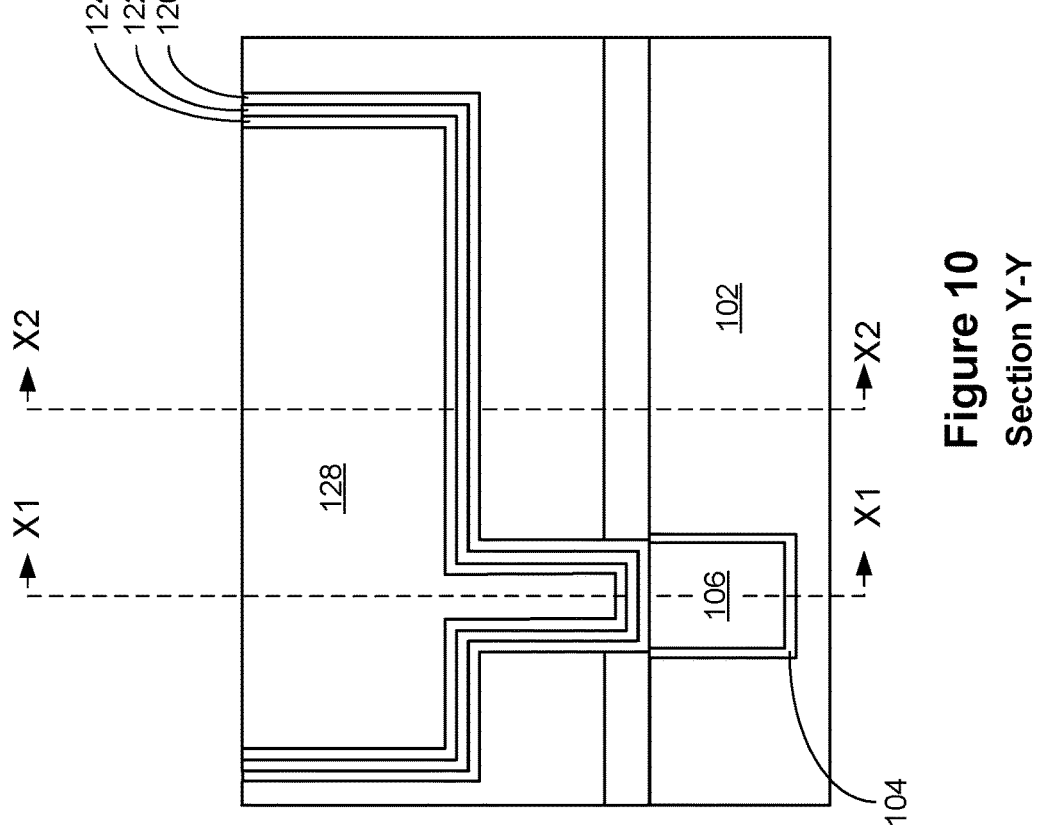
Figure 10:
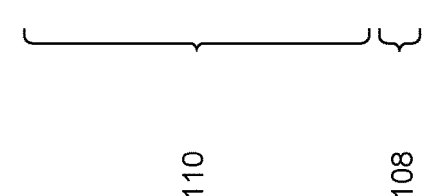

Referring now to FIGS. 8, 9 and 10, the structure 100 is shown according to an exemplary embodiment. FIGS. 8 and 9 are each a cross-sectional view of the structure 100 along section lines X1-X1 and X2-X2, respectively. FIG. 10 is a cross-sectional view of the structure 100 along section line Y-Y. FIGS. 8 and 9 are each perpendicular to section line Y-Y. An outer plate 120, an insulator 122, an inner plate 124 and an inter-layer dielectric (hereinafter "ILD") 128 may be formed in the trench 116.

The outer plate 120 may be formed from a conductive material layer which is blanket deposited on top of the structure 100, and directly on an upper horizontal surface of the Mx-1 metal line 106, on vertical side surfaces of the dielectric cap 108, and on a vertical side surface and a horizontal lower surface of the ILD 110, partially filling the trench 116. The conductive material layer may include materials such as, for example titanium nitride (TiN), tantalum nitride (TaN). The conductive material can be formed by for example, chemical vapor deposition (CVD), physical vapor deposition (PVD), and atomic layer deposition (ALD) or a combination thereof.

The insulator 122 may be conformally deposited on the structure 100. The insulator 122 may be formed by depositing or growing a dielectric material on the structure 100, on the outer plate 120, partially filling the trench 116. The insulator 122 may be deposited using typical deposition techniques, for example, atomic layer deposition (ALD), molecular layer deposition (MLD), chemical vapor deposition (CVD), physical vapor deposition (PVD), high density plasma (HDP) deposition. In an embodiment, the insulator 122 may include any high-k dielectric and may include, but is not limited to $HfO_2$, $ZrO_2$, $La_2O_5$, $Al_2O_3$, $TiO_2$, a high-k dielectric material (with k>4.0), or a combination thereof.

The inner plate 124 may be formed from a conductive material layer which is blanket deposited on top of the structure 100, and directly on an upper horizontal surface of the insulator 122, partially filling the trench 116. The conductive material layer may include materials such as, for example titanium nitride (TiN), tantalum nitride (TaN), copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof.

The ILD 128 may be conformally deposited on the structure 100. The ILD 128 may be formed by depositing or growing a dielectric material on the structure 100, on the inner plate 124, and filling the trench 116.

In an alternate embodiment, the ILD 128 may include a metal fill material, rather than a dielectric material.

A planarization process, such as, for example, chemical mechanical polishing (CMP), may be done to remove excess material from an upper horizontal surface of the structure 100 such that upper horizontal surfaces of the ILD 110, the ILD 128, the inner plate 124, the insulator 122 and the outer plate 120 are coplanar.

Figure 11:
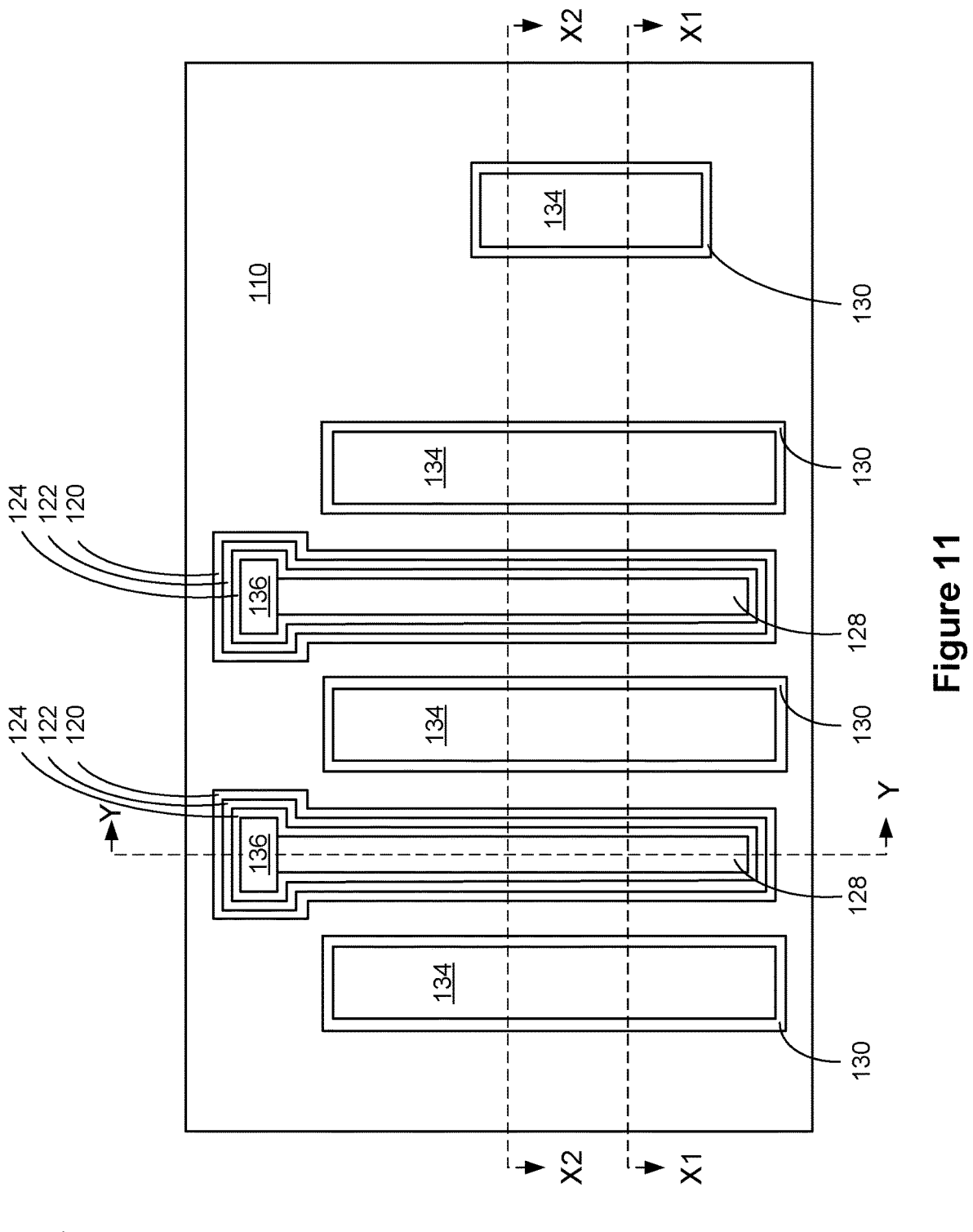
FIG. 11 illustrates a top view of the semiconductor structure, and illustrates formation of a via, a metal line, a cap layer and an inter-layer dielectric, according to an exemplary embodiment.
Figure 12:
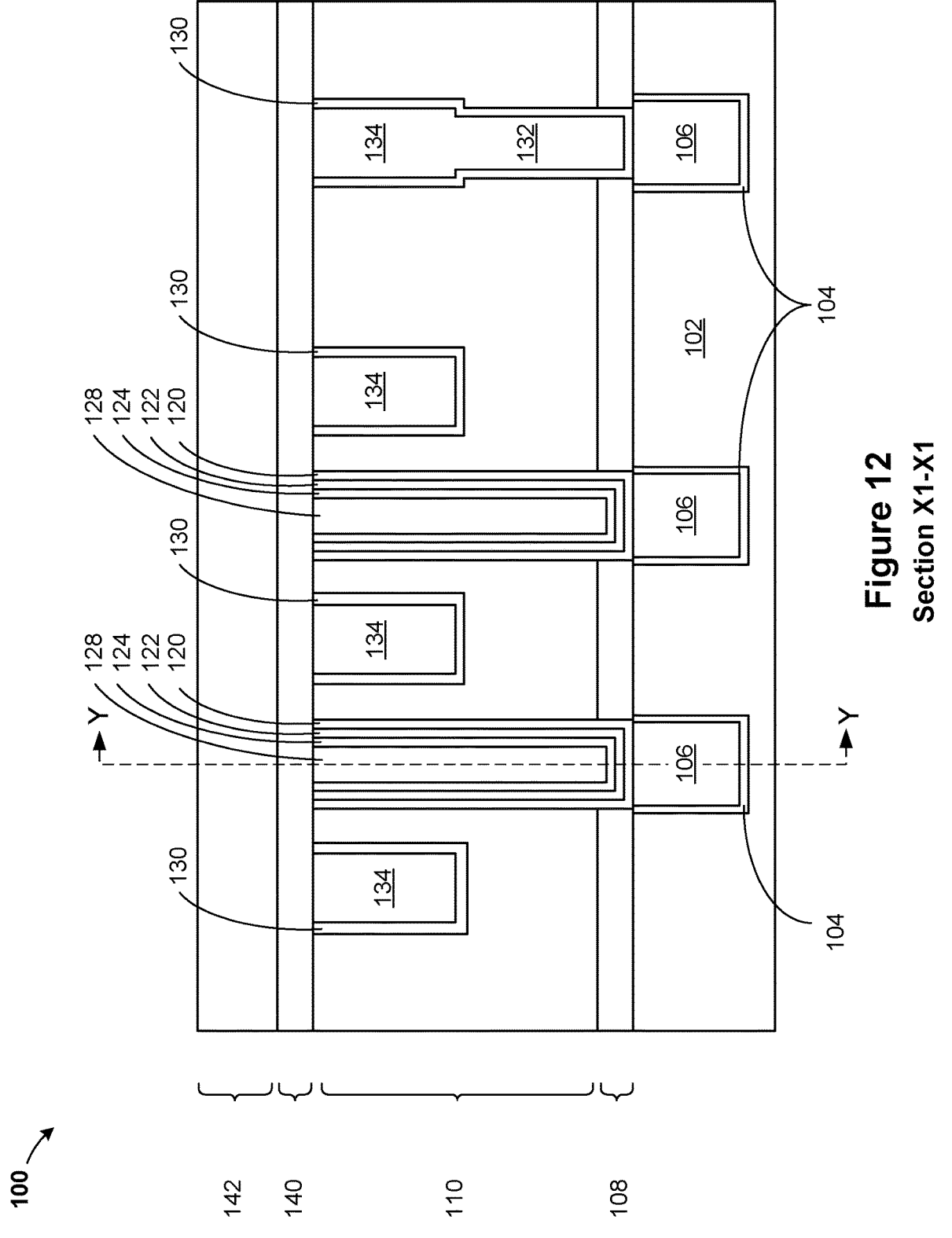
FIGS. 12, 13 and 14 each illustrate a cross-sectional view of the semiconductor structure of FIG. 11 along section line X1-X1, X2-X2 and Y-Y, respectively, and illustrate formation of an outer plate, an insulator, an inner plate and an inter-layer dielectric, according to an exemplary embodiment.
Figure 13:
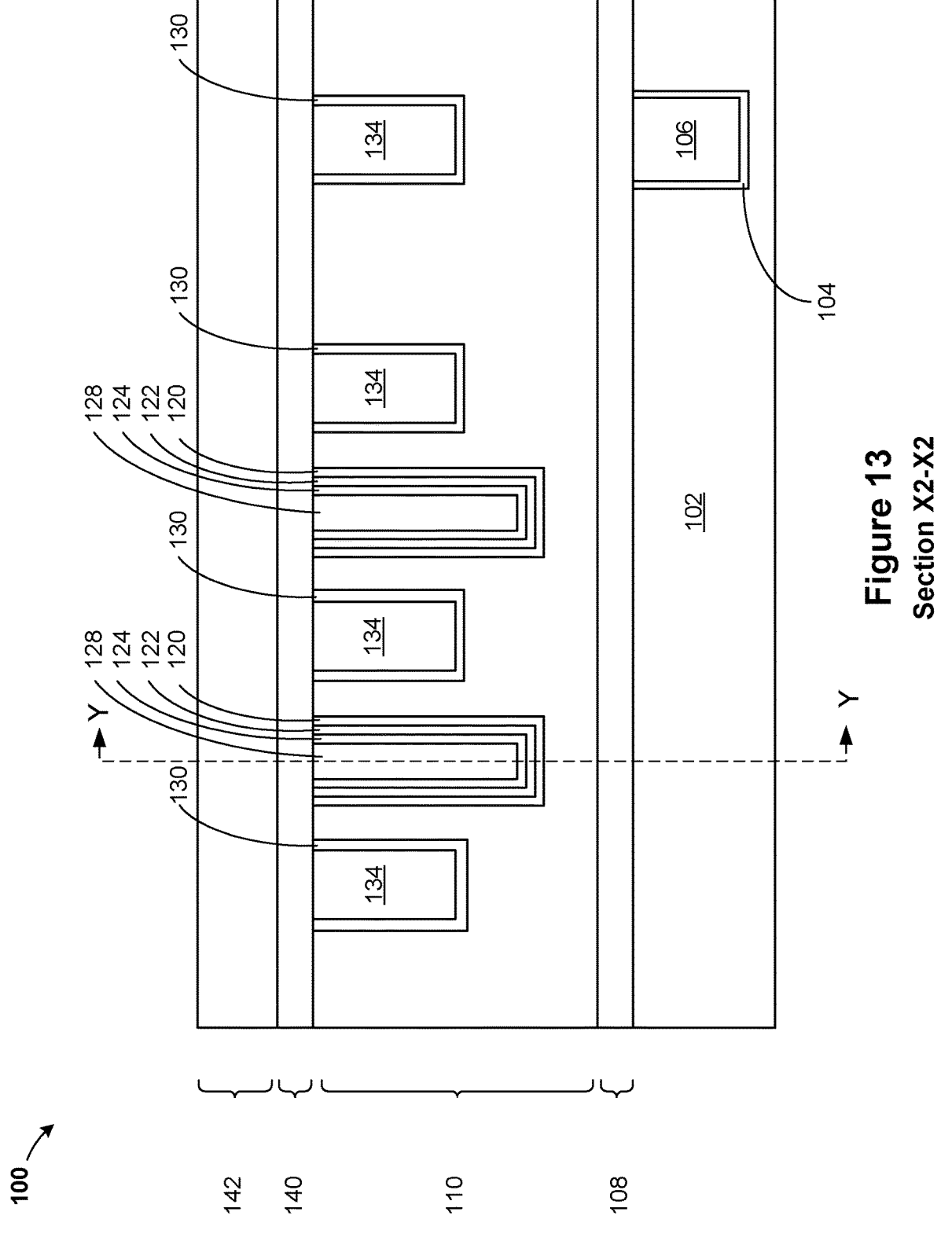
Figure 14:
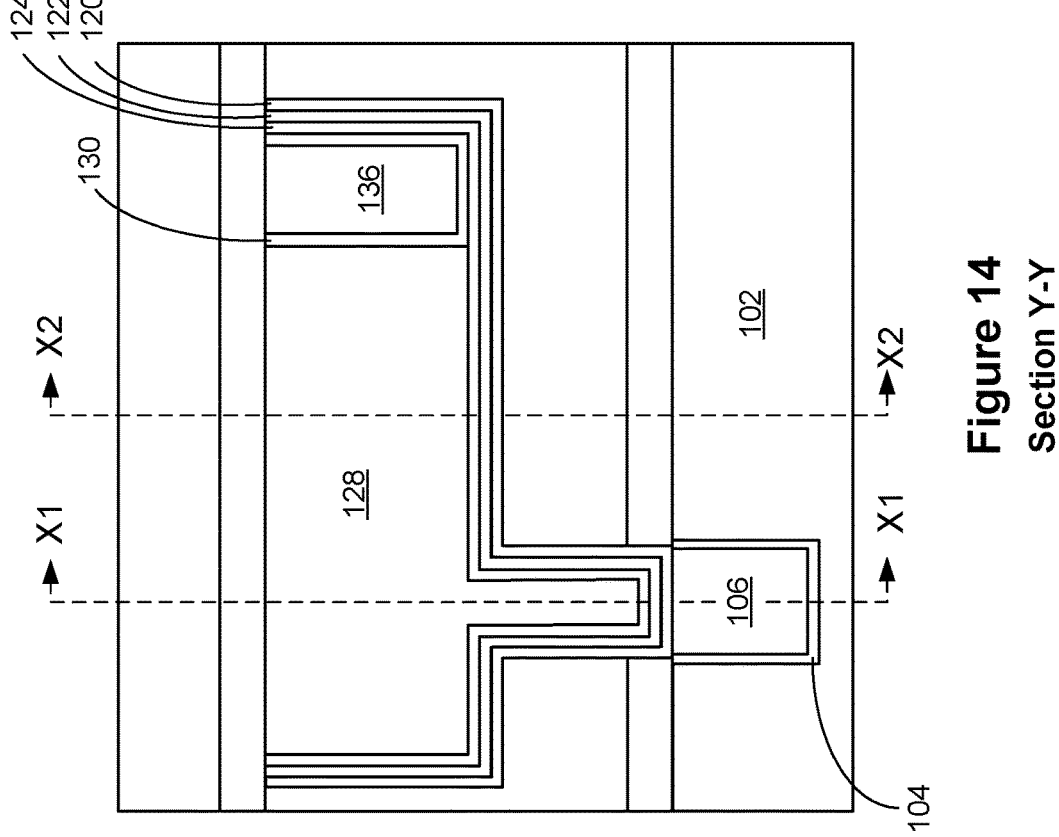
Figure 14:
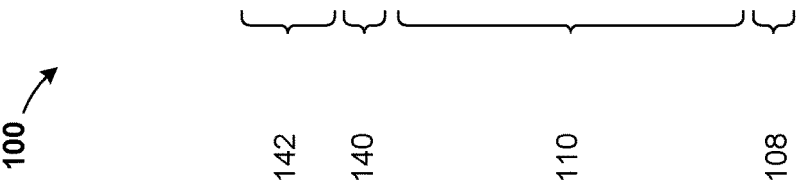

Referring now to FIGS. 11, 12, 13 and 14, the structure 100 is shown according to an exemplary embodiment. FIG. 11 is a top view. FIGS. 12 and 13 are each a cross-sectional view of the structure 100 along section lines X1-X1 and X2-X2, respectively. FIG. 14 is a cross-sectional view of the structure 100 along section line Y-Y. FIGS. 12 and 13 are each perpendicular to section line Y-Y. A liner 130, a via 132, an Mx metal line 134, a dielectric cap 140 and an inter-layer dielectric (hereinafter "ILD") 142 may be formed.

Openings and trenches (not shown) may be formed in the structure 100. The trenches (not shown) may be formed by removal of portions of the ILD 110. The openings (not shown) may be formed by removal of additional portions of the ILD 110 from a lower horizontal surface of a trench (not shown) and portions of the dielectric cap 108, exposing an upper horizontal surface of the Mx-1 metal line 106. The liner 130 may be formed in the openings and trenches (not shown). The liner 130 may be formed as described for the liner 104, along vertical side surfaces and lower horizontal surfaces of the openings and trenches (not shown), on vertical side surfaces and upper horizontal surfaces of the ILD 110 and also on horizontal upper surfaces of the Mx-1 metal line 106.

The via 132, the Mx metal line 134 and the Mx metal line 136 may be formed as described for the Mx-1 metal line 106. The via 132 may include the liner 130 and the conductive material layer formed in the opening and may be formed directly on the upper horizontal surface of the Mx-1 metal line 106. The Mx metal line 134 and the Mx metal line 136 may include the liner 130 and the conductive material layer formed in the trench (not shown). In an embodiment, the Mx metal line 134 and the Mx metal line 136 are each formed in a trench (not shown) which has a lower horizontal surface of the ILD 110. In an embodiment, the Mx metal line 134 and the Mx metal line 136 are formed in a trench (not shown) which is formed on and vertically aligned with the via 132. In an embodiment, the via 132, the Mx metal line 134 and the Mx metal line 136 are formed simultaneously. In an alternate embodiment, the via 132 and both the Mx metal line 134 and the Mx metal line 136 are formed sequentially. There may be any number of vias 132 and Mx metal line 134, on the structure 100. The via 132, the Mx metal line 134 and the Mx metal line 134 may be formed by a damascene process.

In an alternate embodiment, any of the Mx-1 metal line 106, the Mx metal line 134 and the Mx metal line 136 may be copper (Cu), ruthenium (Ru).

A planarization process, such as, for example, chemical mechanical polishing (CMP), may be done to remove excess material from an upper horizontal surface of the structure 100 such that upper horizontal surfaces of the Mx metal line 134, the liner 130 and the ILD 110 are coplanar.

The dielectric cap 140 may be formed as described for the dielectric cap 108, directly on a top surface of the ILD 110, the liner 130 and the Mx metal line 134. The dielectric cap

140 may have a thickness ranging from about 5 nm to about 100 nm, although a thickness less than 5 nm and greater than 100 nm may be acceptable.

The ILD 142 may be formed as described for the ILD 102, directly on an upper horizontal surface of the dielectric cap 140.

The inner plate 124, the insulator 122 and the outer plate 120 form the MIM capacitor of the structure 100. FIGS. 10-14 illustrate two MIM capacitor cells. There may be any number of MIM capacitors in the structure 100. An array of MIM capacitors can include many cells, and some of the cells may be linked to increase the capacitance.

The structure 100 illustrates a MIM capacitor with three terminals. The first terminal of the MIM capacitor is the Mx metal line 134. The second terminal of the MIM capacitor is the Mx-1 metal line 106. The third terminal of the MIM capacitor is the Mx metal line 136.

The MIM capacitor may have a higher capacitance density when fully taking advantage of the 3 plate or 3 terminal option, such as connecting two terminals together as a single electrode. The MIM capacitor may have greater flexibility for different voltage applications. In an embodiment, for a high voltage application, two of the terminals, such as the first terminal and the second terminal may be connected as one electrode and the third terminal may be a second electrode.

In an embodiment, the first, second and third terminals may be traditional interconnects of the structure 100 if not used as terminals of the MIM capacitor.

As illustrated in FIGS. 11-15, the MIM capacitor is between two Mx metal lines 134, connects to the Mx-1 metal line 106 and surrounds the Mx metal line 136. This configuration of the MIM capacitor helps to increase the capacitance of the MIM capacitor and has an advantage of three terminals.

Figure 15:
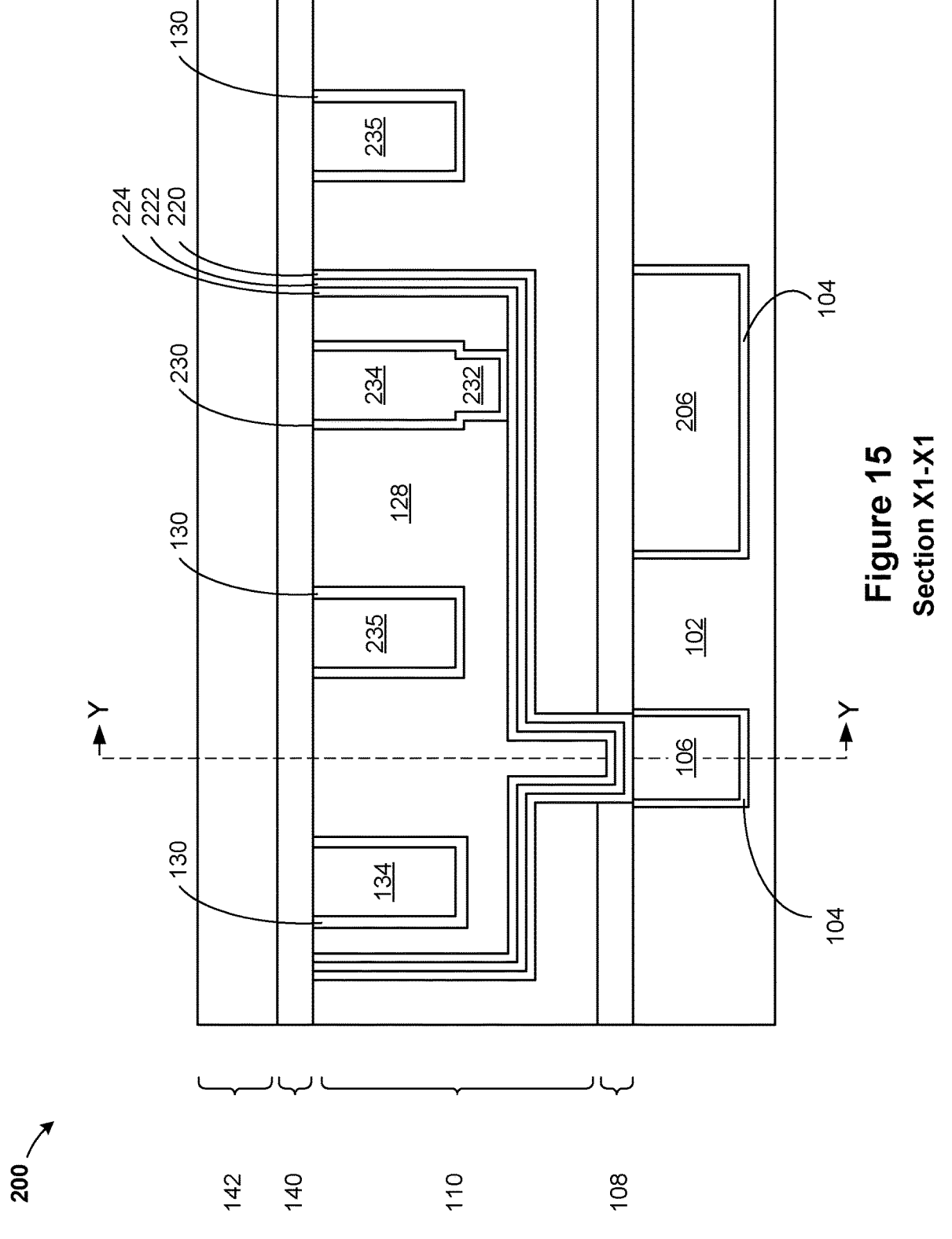
FIG. 15 illustrates a cross-sectional view of a second semiconductor structure along section line X1-X1, according to an exemplary embodiment.
Figure 16:
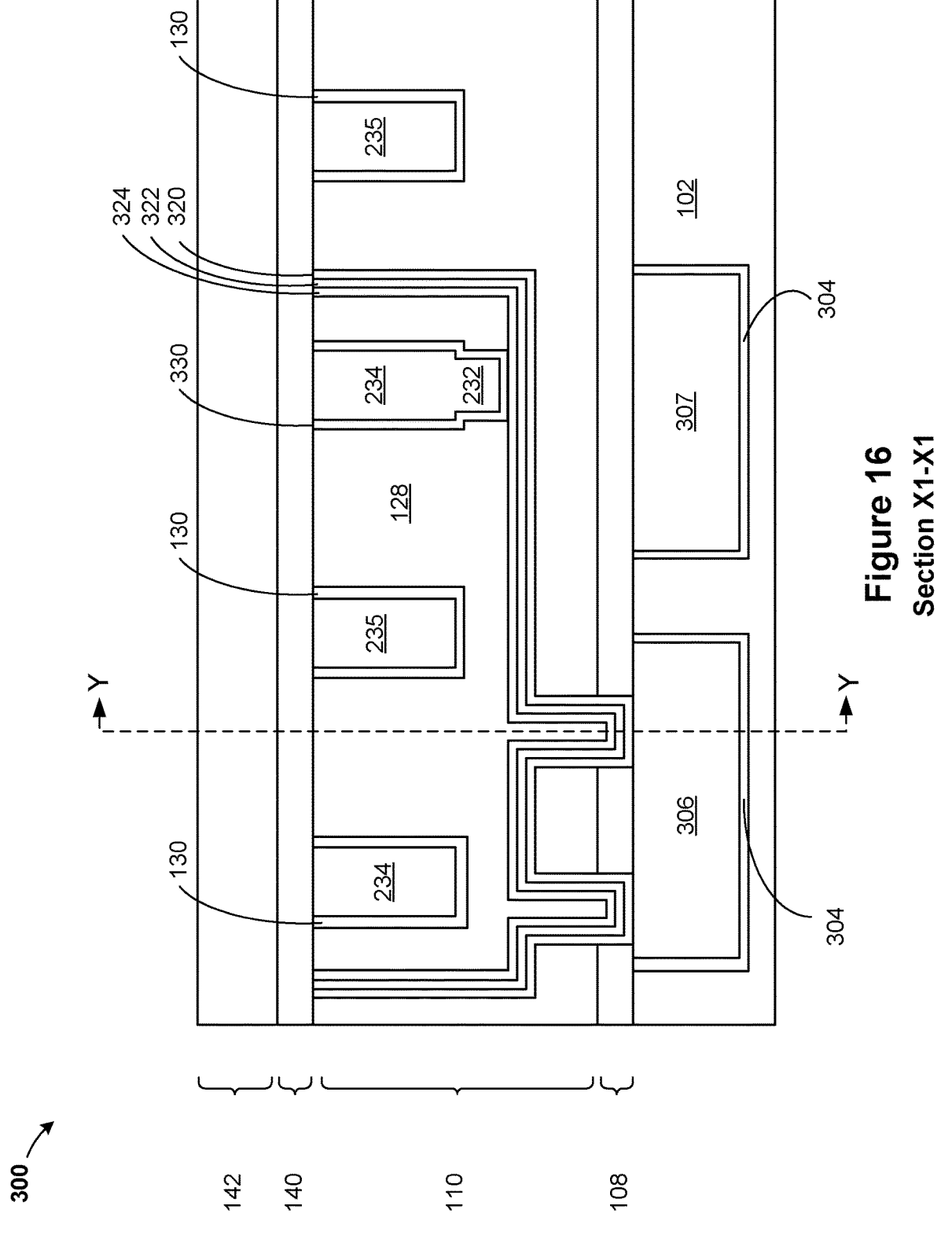
FIG. 16 illustrates a cross-sectional view of a third semiconductor structure along section line X1-X1, according to an exemplary embodiment.
Figure 17:
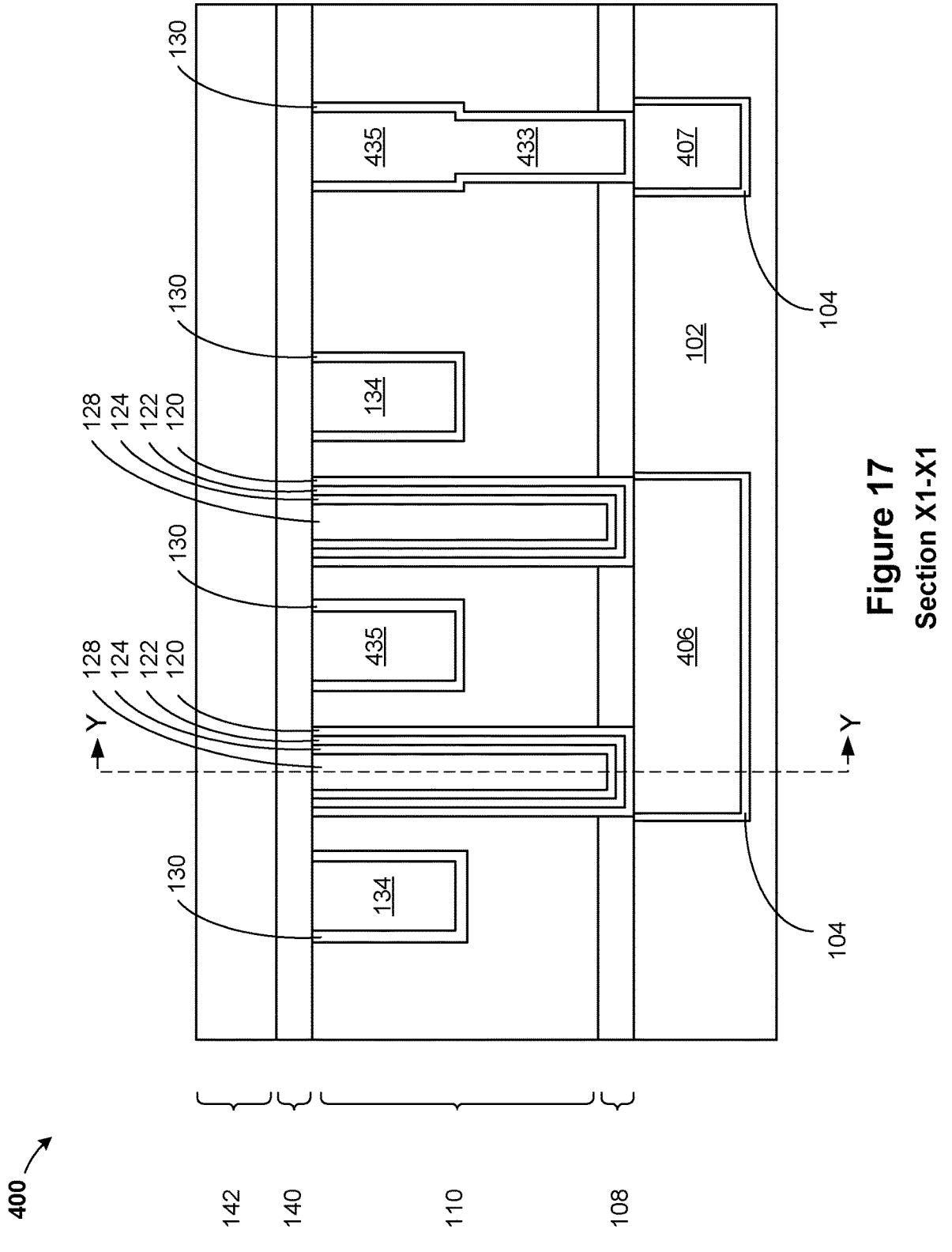
FIG. 17 illustrates a cross-sectional view of a fourth semiconductor structure along section line X1-X1, according to an exemplary embodiment.

FIGS. 15, 16 and 17 each illustrate alternate embodiments of the invention.

Referring now to FIG. 15, a cross-sectional view of a semiconductor structure 200 (hereinafter "structure"), is shown according to an exemplary embodiment. FIG. 15 is a cross-sectional view of the structure 200 along section line X1-X1.

Components of the structure 200 may be formed as described for similarly named components of the structure 100. The structure 200 may include the ILD 102, the liner 104, the Mx-1 metal line 106, the dielectric cap 108, the ILD 110, the Mx metal line 134, the liner 130, the ILD 128, the dielectric cap 140 and the ILD 142.

The structure 200 may include an Mx-1 metal line 206, an outer plate 220, an insulator 222, an inner plate 224, a via 232, an Mx metal line 234 and an Mx metal line 235.

In the structure 200, the Mx-1 metal line 106 may be a MIM capacitor terminal connection and the metal line 206 may be used for normal interconnect wiring independent of the MIM capacitor.

The inner plate 224, the insulator 222 and the outer plate 220 form the MIM capacitor. The Mx metal line 234 is vertically connected to the via 232. The MIM capacitor surrounds three of the Mx metal lines 236. The via 232 connects to the inner plate 224. The Mx metal line 134 and the Mx metal line 234 are part of the MIM capacitor.

The Mx metal lines 235 may be used for normal interconnect wiring independent of the MIM capacitor.

As shown in FIG. 15, the MIM capacitor may surround other components, such as the Mx metal line 235. The MIM capacitor may surround any number of other lines and vias and other components.

Referring now to FIG. 16, a cross-sectional view of a semiconductor structure 300 (hereinafter "structure"), is shown according to an exemplary embodiment. FIG. 16 is a cross-sectional view of the structure 300 along section line X1-X1.

Components of the structure 300 may be formed as described for similarly named components of the structure 100. The structure 300 may include the ILD 102, the dielectric cap 108, the ILD 110, the Mx metal line 134, the liner 130, the ILD 128, the dielectric cap 140 and the ILD 142.

The structure 300 may include an Mx-1 metal line 306, an Mx-1 metal line 307, a liner 304, an outer plate 320, an insulator 322, an inner plate 324, a via 332, an Mx metal line 234 and an Mx metal line 235.

The Mx metal line 307 may be used for normal interconnect wiring independent of the MIM capacitor. The Mx metal line 235 may be used for normal interconnect wiring independent of the MIM capacitor.

The inner plate 324, the insulator 322 and the outer plate 320 form the MIM capacitor. The Mx metal line 334 is vertically connected to the via 332. The MIM capacitor surrounds three of the Mx metal lines 236.

The MIM capacitor has two contacts to the Mx-1 metal line 306 which provide a reduced contact resistance.

Referring now to FIG. 17, a cross-sectional view of a semiconductor structure 400 (hereinafter "structure"), is shown according to an exemplary embodiment. FIG. 17 is a cross-sectional view of the structure 400 along section line X1-X1.

Components of the structure 400 may be formed as described for similarly named components of the structure 100. The structure 400 may include the ILD 102, the dielectric cap 108, the ILD 110, the Mx metal line 134, the liner 130, the outer plate 120, the insulator 122, an inner plate 124 the ILD 128, the dielectric cap 140 and the ILD 142.

The structure 400 may include an Mx-1 metal line 406, an Mx-1 metal line 407, a via 433 and an Mx metal line 435. The Mx-1 metal line 407 may be used for normal interconnect wiring independent of the MIM capacitor. The via 433 and the Mx metal line 435 may be used for normal interconnect wiring independent of the MIM capacitor.

Two cells of a MIM capacitor are adjacent to and connect to the Mx-1 metal line 406. This increases a capacitance of the MIM capacitor for the Mx-1 metal line 406.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a metal insulator metal capacitor (MIM capacitor) within back end of line circuitry of the semiconductor device, wherein the MIM capacitor surrounds a first Mx metal line, and the MIM capacitor comprises three terminals.

2. The semiconductor device according to claim 1, wherein
a lower horizontal surface of the MIM capacitor is vertically adjacent to an upper horizontal surface of an Mx-1 metal line.

3. The semiconductor device according to claim 1, wherein
the MIM capacitor is horizontally between a second Mx metal line and a third Mx metal line.

4. The semiconductor device according to claim 1, wherein
wherein the MIM capacitor surrounds a second Mx metal line and a third Mx metal line.

5. The semiconductor device according to claim 1, wherein
a first lower horizontal surface of the MIM capacitor is vertically adjacent to an upper horizontal surface of an Mx-1 metal line, and
a second lower horizontal surface of the MIM capacitor is vertically adjacent to an upper horizontal surface of the first Mx metal line.

6. The semiconductor device according to claim 5, wherein
a lower horizontal surface of the MIM capacitor is vertically adjacent to the upper horizontal surface of an Mx-1 metal line, and
a lower horizontal surface of a second MIM capacitor is vertically adjacent to the upper horizontal surface of the Mx-1 metal line.

7. A semiconductor device comprising:
a metal insulator metal capacitor (MIM capacitor) within back end of line circuitry of the semiconductor device, wherein
the MIM capacitor surrounds a first Mx metal line, wherein
a lower horizontal surface of the MIM capacitor is vertically adjacent to an upper horizontal surface of an Mx-1 metal line, and the MIM capacitor comprises three terminals.

8. The semiconductor device according to claim 7, wherein
the MIM capacitor is horizontally between a second Mx metal line and a third Mx metal line.

9. The semiconductor device according to claim 7, wherein
wherein the MIM capacitor surrounds a second Mx metal line and a third Mx metal line.

10. The semiconductor device according to claim 7, wherein
a second lower horizontal surface of the MIM capacitor is vertically adjacent to an upper horizontal surface of the Mx-1 metal line.

11. The semiconductor device according to claim 7, wherein
the lower horizontal surface of the MIM capacitor is vertically adjacent to an upper horizontal surface of an Mx-1 metal line, and
a lower horizontal surface of a second MIM capacitor is vertically adjacent to the upper horizontal surface of the Mx-1 metal line.

12. A method of forming a semiconductor device comprising:
forming a metal insulator metal capacitor (MIM capacitor) within back end of line circuitry of the semiconductor device,
wherein the MIM capacitor surrounds a first Mx metal line, and the MIM capacitor comprises three terminals.

13. The method according to claim 12, wherein a lower horizontal surface of the MIM capacitor is vertically adjacent to an upper horizontal surface of an Mx-1 metal line.

14. The method according to claim 12, wherein the MIM capacitor is horizontally between a second Mx metal line and a third Mx metal line.

15. The method according to claim 12, wherein wherein the MIM capacitor surrounds a second Mx metal line and a third Mx metal line.

16. The method according to claim 12, wherein a first lower horizontal surface of the MIM capacitor is vertically adjacent to an upper horizontal surface of an Mx-1 metal line, and a second lower horizontal surface of the MIM capacitor is vertically adjacent to the upper horizontal surface of the Mx-1 metal line.

17. The method according to claim 12, wherein a lower horizontal surface of the MIM capacitor is vertically adjacent to an upper horizontal surface of an Mx-1 metal line, and a lower horizontal surface of a second MIM capacitor is vertically adjacent to the upper horizontal surface of the Mx-1 metal line.

* * * * *